United States Patent [19]
Murphy et al.

[11] Patent Number: 5,574,385
[45] Date of Patent: Nov. 12, 1996

[54] TESTABLE SOLID STATE SWITCH AND RELATED METHOD

[75] Inventors: Kenneth J. Murphy, West Hills; Walter J. Grams, Costa Mesa, both of Calif.

[73] Assignee: ICS Triplex, Inc., Houston, Tex.

[21] Appl. No.: 234,255

[22] Filed: Apr. 28, 1994

[51] Int. Cl.[6] ............................................. G01R 1/04
[52] U.S. Cl. .................................. 324/765; 340/512
[58] Field of Search .................................. 340/512, 513, 340/514; 324/765

[56] References Cited

U.S. PATENT DOCUMENTS

5,428,300  6/1995  Takahashi et al. ...................... 324/770

*Primary Examiner*—Kenneth A. Wieder
*Assistant Examiner*—Barry C. Bowser
*Attorney, Agent, or Firm*—Noel F. Heal

[57] ABSTRACT

A switch module for connection between a power source and a controlled load, and a method for its operation, the switch module being testable without regard to the nature of the load, the nature of the power source, or whether the switch is actually connected to the power supply and its controlled load. The switch module has two pairs of MOS FET solid state switches, each pair connected back-to-back to allow switching of alternating current (ac) as well as direct current (dc) in either direction. Each pair of switches in the module has an associated independent power source, which is used in the preferred embodiment of the invention to supply a control signal to each switch and to supply a test current through the switch when it is closed. Test pulses invert the state of each switch momentarily and corresponding test current pulses are observed if a switch is operating properly. A missing switch-off pulse when the switch module is connected to a load circuit may be caused by the presence of an inductive load, and this is assumed to be case if there is a missing pulse in both pairs of switches. Generating at least two closely spaced test pulses allows elimination of errors arising when one pulse is generated too close to a current zero crossing in an ac circuit.

21 Claims, 4 Drawing Sheets

| | | SW NORMALLY ON | SW NORMALLY OFF |
|---|---|---|---|
| SWITCH OFF-LINE | A1/A2 TEST PULSE | +⎯⎯⎯⎯⎯⎯⎯⎤⎯⎯⎯<br>0⎯⎯⎯⎯⎯⎯⎯⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| | $I_{R1}$ SENSED CURR. | +⎯⎯⎯⎯⎯⎯⎯⎤⎯⎯⎯<br>0⎯⎯⎯⎯⎯⎯⎯⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| | $I_{R2}$ SENSED CURR. | +⎯⎯⎯⎯⎯⎯⎯⎤⎯⎯⎯<br>0⎯⎯⎯⎯⎯⎯⎯⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| SWITCH ON-LINE (DC) | A1/A2 TEST PULSE | +⎯⎯⎯⎯⎯⎯⎯⎤⎯⎯⎯<br>0⎯⎯⎯⎯⎯⎯⎯⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| | $I_{R1}$ SENSED CURR. | +⎯⎯⎯⎯⎯⎯⎯⎤⎯⎯⎯<br>0⎯⎯⎯⎯⎯⎯⎯⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| | $I_{R2}$ SENSED CURR. | +⎯⎯⎯⎯⎯⎯⎯⎯⎯⎯⎯⎯<br>0⎯⎯⎯⎯⎯⎯⎯⎯⎯⎯⎦⎯⎦ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| SWITCH ON-LINE (AC) | A1/A2 TEST PULSE | + - (AC PHASE)<br>+⎯⎯⎤⎯⎯⎯⎯⎯⎤⎯⎯⎯<br>0⎯⎯⎦⎯⎯⎯⎯⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| | $I_{R1}$ SENSED CURR. | +⎯⎯⎤⎯⎯⎯⎯⎯⎯⎯⎯⎯<br>0⎯⎯⎦⎯⎦⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |
| | $I_{R2}$ SENSED CURR. | +⎯⎯⎯⎯⎯⎯⎤⎯⎯⎯⎯⎯<br>0⎯⎯⎦⎯⎦⎯⎦⎯⎯⎯ | +⎯⎯⎯⎯⎯⎯⎯⎯⎯⎯⎯⎯⎯⎯⎯⎯⎯⎯⎯<br>0⎯⎯⎯⎯⎯⎯⎯⎯⎯⎯⎯⎯⎦⎯⎦ |

TESTABLE SOLID STATE SWITCH AND RELATED METHOD

BACKGROUND OF THE INVENTION

This invention relates generally to switches used in programmable controllers and, more particularly, to controllable switches that can be tested periodically to ensure more reliable operation. In many control systems, controllable switches are used to actuate devices such as motors, pumps, valves and so forth. Typically a switch is connected between a power source, which may be an alternating current (ac) source or a direct current (dc) source, and a load, such as a motor or a valve solenoid. In many applications of controllable switches, reliability is of prime importance and techniques have been devised to allow automatic testing of switches of this type. When a switch is in its "on" condition, testing usually involves momentarily turning the switch off and observing the expected cessation of current flow through the switch. When the switch is in its "off" condition, testing may involve momentarily turning the switch on and observing the expected current flow. Switches of the prior art have at least two drawbacks in relation to their testability.

Testing a controllable switch of the prior art requires that the switch be connected to its power supply or its load, or both. However, in many situations there may be additional "permissive" switches connected in series with the controlled switch. The state of these additional switches is, in general, unknown to the designer of the controllable switch and its testing procedures. Therefore, it is not always possible to ensure that the controlled switch is connected to its power supply or to its load. A second difficulty is that some switches of this general type are used to connect dc power sources to their loads and others are used to connect ac power sources to their loads. There are well known problems inherent to on-line testing of ac switches. In particular, the test results are sensitive to the ac phase angle at which the momentary test is performed. Ideally, what is needed is a switch that is testable regardless of whether or not the switch is connected to the load or its power source, and regardless of whether the power source provides alternating current or direct current. The present invention is directed to this end.

SUMMARY OF THE INVENTION

The present invention resides in a solid state switch that includes means for automatically testing the switch regardless of the nature of the power supply and regardless of whether the switch is connected to the power supply or to a controlled load. Briefly, and in general terms, the switch of the invention comprises a pair of unidirectional solid state switches connected back-to-back to permit switching of current flowing in either direction; an independent power source connected to the solid state switches to supply a control signal to operate the switches; means for generating a switch test pulse by momentarily inverting the sense of the control signal operating the switches; and a pair of current sensing circuits connected between the independent power supply and the respective solid state switches, for sensing a current pulse corresponding to the test pulse. The switch module of the invention is testable regardless of whether or not it is connected to a power source or a load, and regardless of whether the power source supplies alternating current or direct current.

In the preferred embodiment of the invention, each current sensing circuit includes an impedance, a current detector and a blocking diode, connected in series between the independent power source and one of the solid state switches. A test current flows through the current sensing circuit when the solid state switch to which it is connected is closed, and this current is sensed to determine whether the switch is operating properly. The blocking diode blocks relatively high voltages from reaching the current sensing circuit. The current detector in each current sensing circuit of the presently preferred embodiment includes an optoelectronic coupler, to provide an indication of current flow without a direct electrical connection.

More specifically, each of the solid state switches is a field effect transistor (FET) having source, drain and gate terminals. The source terminals of the pair of FETs are connected together, the drain terminals are connected to a field circuit between a power source and a load, and gate terminals are connected together to a switch control contact. The independent power source is connected between the source terminals and the switch control contact, whereby closure of the switch control contact applies a control signal to the gate terminals and closes the solid state switches.

Preferably, the switch module of the invention further comprises a second pair of solid state switches, a second independent power source, separate means for generating a switch test pulse, and a second pair of current sensing circuits. The second pair of solid state switches is connected in series with the first pair and is testable independently of the first pair. The module of the invention further includes means for comparing test results from the two pairs of solid state switches, to eliminate any uncertainty in the test results, such as might be caused in the presence an inductive load.

In accordance with another aspect of the invention, the means for generating a switch test pulse functions to generate a second switch test pulse spaced such that at least one of the switch test pulses occurs during a non-zero portion of an alternating current waveform. In the embodiment illustrated, the second switch pulse occurs after a time corresponding to a phase angle of approximately 270° in the alternating current waveform.

The invention may also be defined as a solid state testable switch module for connection in a load circuit between a power source and a controlled load, the switch module comprising a first pair of solid state switches connected back-to-back to permit switching of current flowing in either direction, the switches each having a control terminal and two field terminals for connection to the load circuit; and a second pair of solid state switches connected back-to-back to permit switching of current flowing in either direction, the switches each having a control terminal and two field terminals for connection to the load circuit, wherein the second pair of switches is connected in series with the first, through their field terminals. The module further includes first and second independent power sources connected to the first and second pairs of solid state switches to supply control signals to operate the switches; first and second switch control contacts, for selectively connecting the first and second independent power sources to the control terminals of the first and second pairs of solid state switches; means for generating switch test pulses in the first and second pairs of switches by momentarily inverting first and second switch control contracts and, therefore, inverting the control signal operating the switches; and first and second pairs of current sensing circuits connected between the first and second independent power supplies and the respective solid state switches, for sensing a current pulses corresponding to the test pulses. The switch module is testable regardless of whether or not it is connected to a power source or a load, and regardless of whether the power source supplies alternating current or direct current.

In terms of a novel method, the invention comprises the steps of generating a test pulse through a first solid state switch by momentarily inverting the state of the switch; applying a test voltage from an independent power source to the switch in addition to any load circuit voltage to which the switch may be subjected; and sensing flow of test current through the switch while the test pulse is being generated. A sensed current pulse having the same direction as the test pulse is indicative of a properly operating switch. The method may further comprise the steps of generating a test pulse through a second solid state switch connected back-to-back with the first to permit switching of alternating current; applying a test voltage from the same independent power source to the second switch; and sensing test current flow through the second switch while the test pulse is begin generated. A sensed current pulse having the same direction as the test pulse through the second switch is indicative of a properly operating switch.

The method may also include generating a second test pulse through the first and second solid state switches. The second pulse is spaced from the first by a time corresponding to an alternating current phase angle selected such that at least one of the first and second test pulses occurs at a region of the alternating current waveform in which reliable results are obtained; then sensing test current flow through the first and second switches while the second test pulse is being generated; and finally, ignoring the test results obtained from one of the test pulses if the results obtained from the other test pulse indicate that the switches operate properly.

The method in accordance with another aspect of the invention includes generating a test pulse to a second pair of solid state switches connected in series with and having a similar structure to the first pair; sensing the resultant currents in the second pair of solid state switches; comparing the resultant currents obtained in the first and second pairs of solid state switches; and ignoring any missing current pulse sensed in one pair of switches if a corresponding current pulse is missing from pulses sensed in the other pair of switches. A pulse that is missing because of load characteristics should be missing in both pairs of switches.

It will be appreciated from the foregoing that the present invention represents a significant advance in the field testable switches for use in programmable controllers and the like. The switch of the invention is testable for open and short conditions regardless of whether it is disconnected, i.e. off-line, or is connected to switch direct or alternating current. The use of test data from a pair of switches in series in the module of the invention allows the module to be tested even when connected to highly inductive loads. Further, using multiple test pulses allows testing to be performed without knowledge of the phase of an alternating current being switched. Other aspects and advantages of the invention will become apparent from the following more detailed description, taken together with the accompanying drawings.

DESCRIPTION OF THE PREFERRED EMBODIMENT

Figure 1:
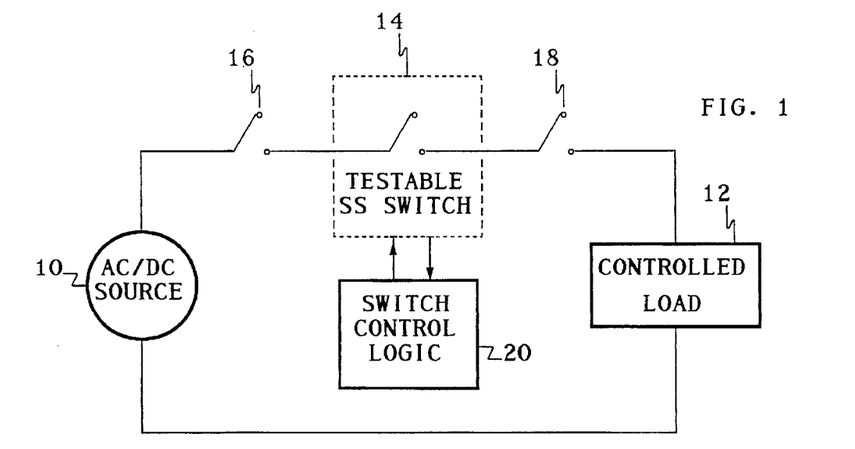
FIG. 1 is block diagram depicting how the switch of the invention is connected between a power supply and a controlled load.

As shown in the drawings by way of illustration, the present invention pertains to a testable solid state switch suitable for switching current on and off in environments in which safety and reliability of operation are critical. FIG. 1 shows by way of example a power source, indicated by reference numeral 10, connected to a controlled load 12 through a number of series-connected switches, including the testable solid state switch 14 of the invention and two additional "permissive" contact switches 16 and 18. In general, a control circuit such as the one shown may have any number of permissive contacts between the power source 10 and the load 12. Of course, all of the series-connected contacts must be closed to connect the power source 10 to the load 12. To ensure reliability of operation, a switch may be tested by actuating it periodically, i.e., momentarily closing a normally open switch or momentarily opening a normally closed switch. Ideally, a switch should be tested both for unwanted open circuits when the switch is considered to be closed and unwanted short circuits when the switch is considered to be open. Switch control logic 20 provides control signals to operate and test the switch 14, and senses the condition of the switch as the control signals are applied. In the past, testing has required that the switch be connected to its power supply or to its load, or both, but the presence of the additional permissive contacts 16 and 18 means that this condition cannot always be satisfied. Therefore, the switch could not always be reliably tested. Further, if the power source 10 supplies alternating current (ac), test pulses in switches of the prior art must be carefully synchronized with the phase of the alternating current.

In accordance with the present invention, a solid state switch is testable regardless of whether the load and the power source are connected to the switch, regardless of whether the power source is dc or ac, and regardless of the nature of the load, i.e. whether it is resistive or inductive. These advantages are achieved in the preferred embodiment of the switch shown in FIG. 2. The preferred embodiment includes two series-connected switches 14A and 14B, which will be referred to as the A switch and the B switch, each of which has two metal oxide semiconductor field effect transistor (MOS FET) switches connected in a back-to-back arrangement to permit the switching of either direct or alternating currents. The MOS FET switches will be referred to as switches A1 and A2 (included in the A switch), and switches B1 and B2 (included in switch B). As is well known, a MOS FET has source, drain and gate terminals, indicated as S, D and G in the drawings, and may be configured as an on/off switch such that current will flow from the drain to the source when the gate is biased positively with respect to the source. Inherently, each MOS FET also includes a diode between its source and drain terminals. In the back-to-back configuration, the source terminals of switches A1 and A2 are connected together, and a control signal (control A) is applied to both gates in common. At any time, only one of the switches A1 and A2 functions to control the condition of the switch, depending on the direction of current flow. For example, if the load current flows through switch A1 and then through switch A2, switch A1 will control the current flow. If a positive "on" signal is applied to the gates of switches A1 and A2, switch A1 will be turned on and will conduct current from its drain to its source. In this condition, switch A2 conducts simply because it functions inherently as a forward-biased diode, and the signal applied to its gate plays no part in the control of the switch. If the current flow is reversed, switch A2 controls the switch and switch A1 functions as a forward-biased diode. This well known characteristic of MOS FETs connected back-to-back enables the configuration to switch either direct current of any polarity or alternating current.

Figure 2:
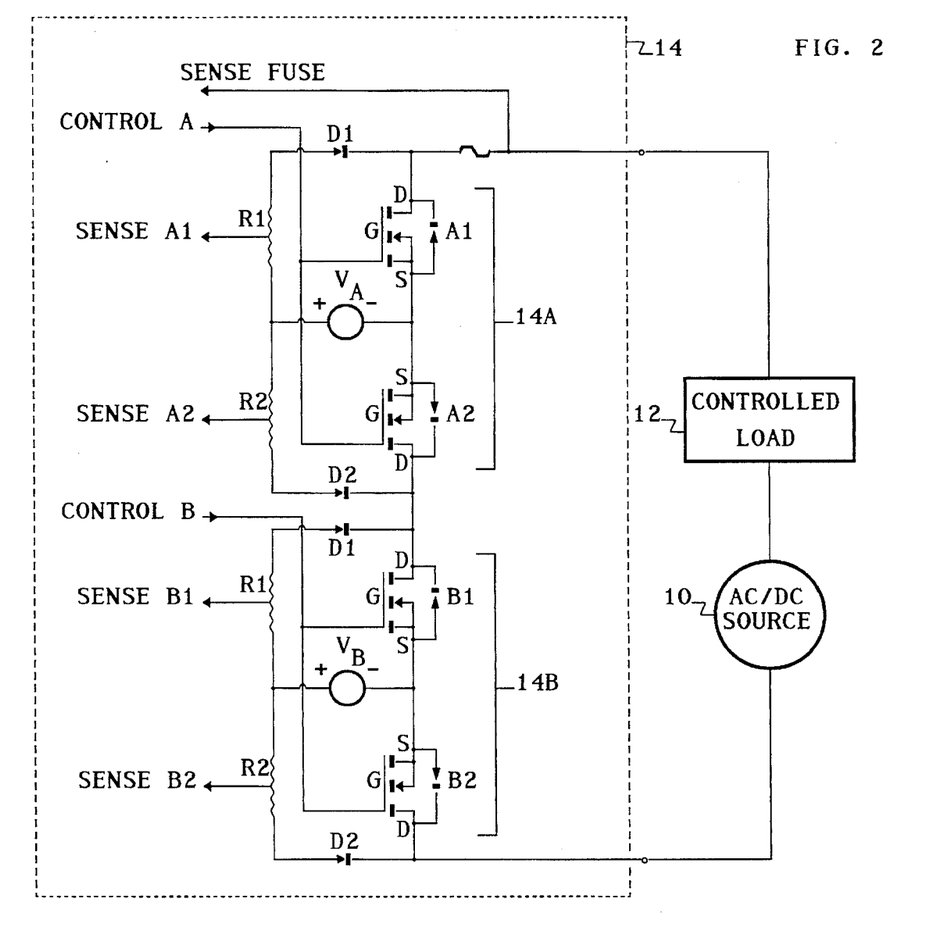
FIG. 2 is a simplified circuit diagram of the switch of the invention, shown in its preferred form with two identical switches connected in series to ensure failsafe operation.

The primary purpose of switch B is to provide failsafe operation. In many applications of switches, the safe condition is the "off" condition, but if a controlled switch fails in such a way as to remain permanently shorted or closed, there is no way to switch the controlled load off. A second switch in series allows disconnection of the load from the power supply if the first switch fails to open. Only a simultaneous failure of both switches would prevent disconnection of the power from the load. As further discussed below, the use of two switches in series also permits testing of the switches in a variety of load and power conditions.

The switch 14 shown in FIG. 2 may be connected with identical modules in a variety of configurations. For fault tolerance, two of the switch modules 14 may be connected in parallel and continually tested while in operation. If a fault is detected in one of the switch modules, it may be replaced without disconnecting power from the other components. The ability to replace modules in this manner, sometimes referred to as "hot replacement," is essential for some types of control systems. Multiple switch modules may be connected to a common power supply in some configurations, or may be connected to independent and isolated power supplies in other configurations. In both cases, operation and testing of the modules is performed in the same manner, which will now be described in detail.

Figure 3:
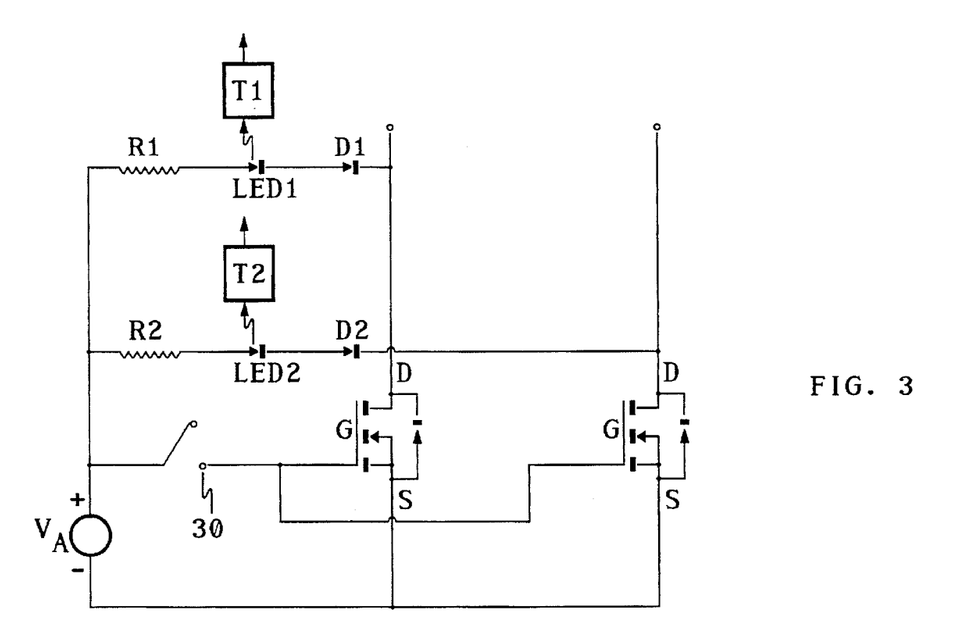
FIG. 3 is a circuit diagram of a single switch like those shown in FIG. 2, with the components spatially rearranged for easier explanation of its operation.

Because the switch module 14 must be testable regardless of whether there is connection to the power source 10, the A switch and the B switch in the module each has an independent power supply, indicated as $V_A$ as $V_B$ in the drawings. These are isolated floating power supplies connected by their negative terminals to the source terminals of the A switch and B switch, respectively. As best shown in FIG. 3, these power supplies are used in the preferred embodiment to provide a bias signal to the gate terminals of the A and B switches, to close the switches on command, and to provide power for sensing the condition of each switch. The sensing circuit for switch A1 includes a resistor R1 and a diode D1 connected in series between the positive terminal of independent power supply $V_A$ and the drain terminal of switch A1. The diode D1 functions to block high load circuit voltages from reaching the sensing circuit. Current flows through resistor R1 only when the switch A1 is closed. This test current may be sensed by any convenient means, but in the preferred embodiment an opto-electronic coupler is used both to sense the current flow and to isolate the testing logic from possibly high field circuit voltages associated with the load. As shown in FIG. 3, the opto-electrical coupler for the A1 switch includes a light emitting diode LED1 and an associated light sensing transistor T1.

The independent power supply $V_A$ is also connected to a resistor R2 and a blocking diode D2, for detecting current flow through the switch A2. Detection of current through resistor R2 is by means of light emitting diode LED2 and light sensing transistor T2. Similar components are used in switches B1 and B2 for sensing current flow through these switches.

As best shown in FIG. 3, switches A1 and A2 are controlled by a switch 30. Switch 30, which is controllable both by the a user of the switch and by the switch control logic 30 during testing, is shown as a simple single-pole switch connected between the positive terminal of power supply $V_A$ and the gate terminals of switches A1 and A2. The switch 30 may be of any appropriate design, but in the preferred embodiment an opto-electronic coupler is used to ensure isolation between logic signals used to control the switches and field voltages applied to the load. The switch 30 may be opened and closed by a user to control the connected load 12, and is also controlled in accordance with the invention to test operation of the switches. Operation of the testing circuitry will now be described for three different field circuit conditions: (1) when the switch is off-line, with no power source or load connected to it, (2) when the switch is connected to a dc power supply and load, and (3) when the switch is connected to an ac power supply and load. Waveforms of test signal pulses and resultant test currents are shown for these three conditions in FIG. 4.

Figure 4:
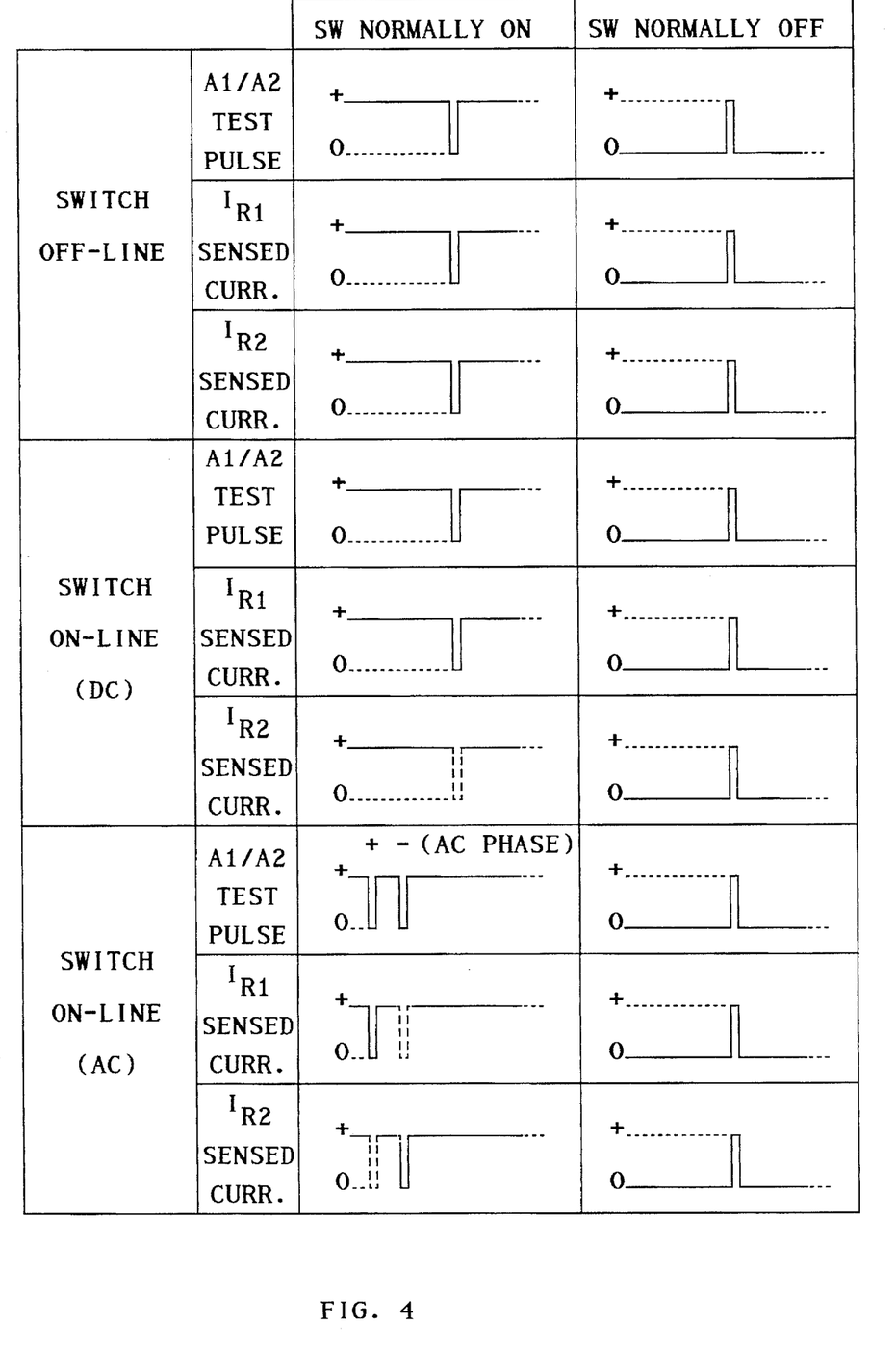
FIG. 4 is a table depicting voltage and current waveforms associated with the switch of FIG. 3 for various connection conditions.

In the off-line condition, the switch may be either in the open condition or the closed condition. Testing of the switch module involves momentarily inverting the condition of the switch, by momentarily closing or opening the switch 30. If the switch 30 is closed, current will flow through both resistor R1 and resistor R2, through switches A1 and A2, respectively, and back to the power supply $V_A$. When the switch 34 is momentarily opened, there will be a corresponding cessation of current in resistors R1 and R2, as indicated in FIG. 4. The current through resistors R1 and R2 is shown as having a zero-magnitude pulse during the "off" periods of the switches A1 and A2. As further shown in FIG. 4, the situation is simply reversed if the switches A1 and A2 are normally off and are pulsed momentarily to the "on" condition, causing detectable current pulses in the resistors.

When direct current is supplied by the power source 10, the situation is similar but not identical to the off-line condition. However, a significant difference arises because of the current path followed by the sensing signal when a dc source and load are connected to the switches. For the normally "on" case, one of the switches A1 and A2 will be controlled to its "on" condition by the applied gate bias voltage, but the other of the switches will conduct through its inherent forward-biased diode. For example, if load current flows from the drain terminal to the source terminal of switch A1, switch A1 will control the flow of current, depending on the signal applied to its gate terminal. Switch A2 will conduct the load current through its inherent forward-biased diode, and will play no part in the switching function. When the A switch is commanded to the "on" condition, to connect a dc power source to its load, the current through switch A1 has two components: the load current flowing from the power source 10 and the test current flowing from the independent power supply $V_A$. When the load current flows through the switch, the voltage at the source terminal of switch A1 is practically zero, so the test current can flow through the blocking diode D1 and through the switch A1 itself. To test the ability of the switch to open, the switch 30 is momentarily opened, causing the load current to drop momentarily to zero. For most loads, such as motors, this momentary current drop does not affect operation of the load. During the time that the switch A1 is open, the voltage at the source terminal rises to the power supply voltage, typically 110–120 volts. Therefore, the blocking diode D1 becomes reverse-biased and the test current can no longer flow through resistor R1.

When the A switch is "on," the A2 portion of the switch is conducting current through its intrinsic diode from the source terminal to the drain terminal and, as mentioned above, the A2 switch does not control load current. However, the condition of switch A2 has a significant effect on the test current through resistor R2. Although the same magnitude of current will be detected through resistor R2, the current path will not be through switch A2 (as in the off-line case) but will be through the load 12 and power supply 10, and thence back to the negative terminal of the independent power supply $V_A$. The current through resistor R2 does not necessarily fall to zero when switch A2 is opened. Because the test current sensed as flowing through resistor R2 also flows through the load, the time it takes to drop to zero is dependent on the nature of the load. If the load is purely resistive, the current through resistor R2 will drop immediately to zero, like the current through resistor R1, but if the load has a significant inductive component, as is the case for a motor, the current will not drop perceptibly during the relatively short test pulse interval, which may be approximately 100 μs (microseconds). Since the nature of the load is not always known, testing the switch in the "on" condition will not necessarily result in a momentary drop in the test current to both A1 and A2. Therefore, the pulse is shown as a broken line in FIG. 4.

The uncertainty of the test results caused by the nature of the load in a dc circuit could, of course, be avoided by simply eliminating one of the switches A1 and A2 from the switch module. In the dc case, only one of the switches actually controls the condition of the switch module and the other operates simply as a forward-biased diode and is not needed for dc switching. The difficulty with this solution is that it requires a specially configured switch module that could not operate with ac power sources, and would also be sensitive to the polarity of a dc power source. Another possibility is to provide a status signal indicating whether the switch module is on-line, i.e. connected to a load, or off-line. Clearly, if pulsing the switch off when in the "on" condition resulted in an apparent failure when the module was known to be off-line, then it could be reasonably concluded that the switch was defective. A similar apparent failure in the on-line condition could be simply due to the load condition. However, providing the on-line or off-line status to the switch module adds a further level of complexity to its design and does not totally eliminate the uncertainty.

An important goal of the present invention is to provide a switch module that can be used with both ac and dc power sources, without regard to connection to an external load circuit, and without regard to the nature of the load. The testable switch of the invention meets this goal, in part because it includes two switches (A and B) in series. As previously discussed, this configuration satisfies a failsafe requirement, but it also provides additional test data that can be used to reduce the uncertainty caused by the presence of inductive loads. If both the A switch and the B switch yield test results in which identical segments of both switches (e.g. switch A2 and switch B2) fail to provide a sensed current that drops to zero when pulsing a normally "on" switch to the "off" condition, then it can be safely assumed that the "failure" is simply due to an inductive load, which would affect both switches A and B in an identical way.

The uncertainty referred to above does not exist in the case of testing a 30 normally "off" switch by pulsing it to the "on" condition. When both A1 and A2 are "off" for a relatively long time, any inductive load will have no stored energy associated with it and the circuit will have stabilized to a condition in which the drain terminals of A1 and A2 will be at the positive voltage $V_A$ of the independent power supply, or a higher voltage. When the switches are closed by a test pulse, current will flow from drain to source through one of the switches, such as A1, and will flow from source to drain of A2 through the external load circuit. In this condition, however, there should be an immediately perceptible current pulse through resistor R2.

If the power source 10 supplies alternating current, a similar uncertainty exists with respect to testing the ability of the switch to turn off. However, because the direction of current flow alternates, either the R1 or the R2 current may not switch off during the test. An additional element of uncertainty arises in the ac case because the phase of the ac current is not "known" by the switch. When the current through the switch (and through an inductive load) is passing through a zero value, there is no energy stored in the load at that instant and, if a switch-off test were to be performed, the likely result would be the detection of a test pulse in both segments of the switch (e.g., switches A1 and A2). However, if the same test were to be performed at an instant when the current was non-zero, again assuming an inductive load, the likely result would be the detection of a test pulse on only one of the switches A1 and A2. Over a critical range of phase angles of the ac current, there is a high degree of uncertainty as to whether both of the switches will yield a test pulse. Therefore, switches A and B might yield different results, even if there were nothing wrong with either switch. The solution adopted in the preferred embodiment is to perform two successive tests at phase angles spaced apart sufficiently to ensure that at least one of the tests will not be made in the critical range of phase angles in which the uncertainty exists. Because the critical range of phase angles is in the vicinity of the current zero crossings, the present embodiment of the invention achieves good results by simply performing two successive tests spaced apart by an interval equivalent to approximately 270°. For a 60-Hertz power supply, this time interval is 12.5 ms (milliseconds). Of course, it will be understood that the uncertainty of testing an ac switch on-line may also be reduced by performing more than two closely spaced tests, or by using spacings other than 270°.

Figure 5:
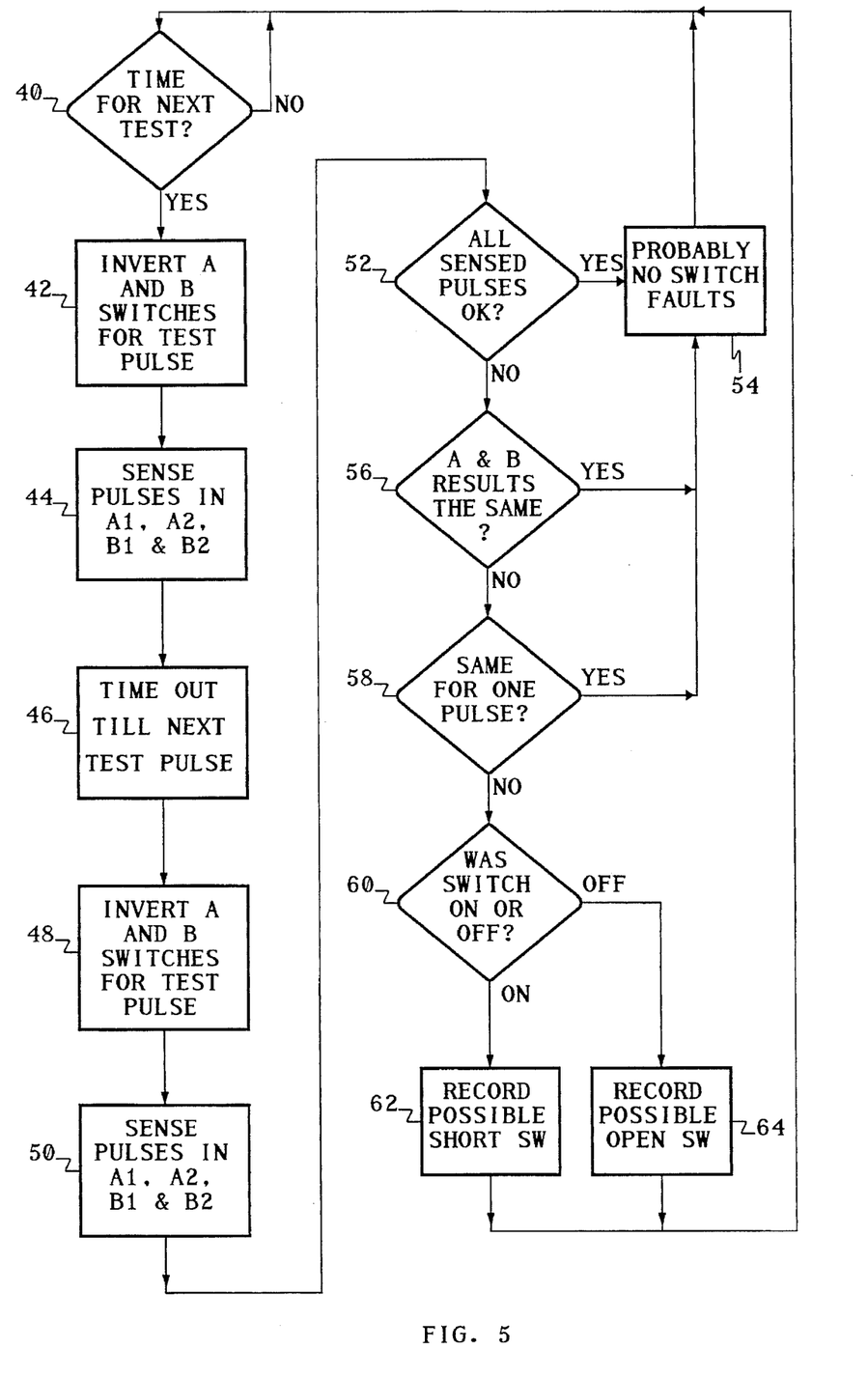
FIG. 5 is a flowchart depicting the functions performed by switch control logic associated with the switch of the invention.

FIG. 5 is a flowchart showing the functions performed by the switch control logic 20 of the invention. It will be understood that this is for purposes of illustration and that various other logical flow sequences might be used to achieve the same result. The testing logic operates on a timed basis, testing switches in each switch module every few seconds or every few minutes, depending on the application of the switches and the predicted time between failures. Specific test algorithms based on device failure rates and the criticality of those failures to a specific process, are beyond the scope of the present invention. As indicated in decision block 40, the switch test logic waits in an idle condition until it is time to perform the next test. To initiate the test, the logic inverts the condition of switch 30 for a brief period of time, such as 100 μs, momentarily opening the switch if it is normally closed, or closing it if it is normally open. This action is shown in block 42. At the same time, the logic senses expected changes in the test current supplied to switches A1, A2, B1 and B2, as indicated in block 44. The logic then times a short delay interval, as indicated in block 46, before performing an identical second test. As previously discussed, the delay period may be equivalent to approximately 270° in the phase of an ac power signal. The switches 30 are pulsed for a second time, as indicated in block 48, and the resultant current pulses are sensed, as indicated in block 50. The test logic now has sufficient information to identify possible switch faults in switches A and B.

If all the sensed pulses are correctly sensed within reasonable limits, as indicated in block 52, there are probably no switch faults (as indicated in block 54), and the logic returns to a wait state until it is time for the next test. If any expected current pulse is not detected, a comparison is made between the results from the A and B switches, as shown in decision block 56. If the same test failed to yield a test pulse in both switches (e.g. no test current pulse in switches A2 and B2), it is likely that there is no defect in either switch, and the condition may be treated the same as if all the expected test pulses were present. If the test results from switches A and B are not the same, the discrepancy may be due to the timing of the test with respect to the phase of an ac power source. In this case the results are analyzed for each of the two test pulses generated in succession, as indicated in decision block 58. If either of the test pulses produces identical results in both the A and B switches, it is likely that there is no defect in either switch. Failure of this test means that there is the possibility of a defect in one of the switches. If the switch was normally "on," as determined in block 60, the defect is a possible short-circuited switch, as indicated in block 62. If the switch was normally "off," the defect is a possible open-circuited switch, as indicated in block 64. How this information is subsequently used is a matter of user preference. Typically, an alarm condition is not declared until a defect has been consistently detected, but in some critical applications an alarm condition may be declared immediately on detection of a possible defect.

The functions described with reference to FIG. 5 may be performed in a user's controller, or may be performed jointly by a user's controller and a switch controller integrated with switch module. In the presently preferred embodiment, lower level testing functions, such as generation and timing of the test pulses, are performed in logic associated directly with the switch module. Analysis of the test results and possible declaration of alarm conditions are considered application-dependent functions, which are more conveniently performed in a user's controller.

It will be appreciated from the foregoing that the present invention represents a significant advance in the field of testable switches for programmable controllers. In particular, the invention provides a solid state switch that can be tested for open and short conditions regardless of whether a power source or load is connected to the switch, regardless of whether the power source is ac or dc, and regardless of the nature of the load. It will also be appreciated that, although a specific embodiment of the invention has been described in detail for purposes of illustration, various modifications may be made without departing from the spirit and scope of the invention. Therefore, the invention should not be limited except as by the appended claims.

We claim:

1. A solid state testable switch module for connection between a power source and a controlled load, the switch module comprising:

a pair of unidirectional solid state switches connected back-to-back to permit switching of current flowing in either direction;

an independent power source connected to the solid state switches to supply a control signal to operate the switches;

means for generating a switch test pulse by momentarily inverting the sense of the control signal operating the switches; and a pair of current sensing circuits connected between the independent power supply and the respective solid state switches, for sensing a current pulse corresponding to the test pulse;

whereby the switch module is testable regardless of whether or not it is connected to a power source or a load, and regardless of whether the power source supplies alternating current or direct current.

2. A solid state testable switch module as defined in claim 1, wherein each current sensing circuit includes:

an impedance, a current detector and a blocking diode, connected in series between the independent power source and one of the solid state switches, wherein a test current flows through the current sensing circuit when the solid state switch to which it is connected is closed, and wherein the blocking diode blocks relatively high voltages from reaching the current sensing circuit.

3. A solid state testable switch module as defined in claim 2, wherein the current detector in each current sensing circuit includes an opto-electronic coupler, to provide an indication of current flow without a direct electrical connection.

4. A solid state testable switch module as defined in claim 1, wherein:

each of the solid state switches is a field effect transistor (FET) having source, drain and gate terminals;

the source terminals of the pair of FETs are connected together, the drain terminals are connected to a field circuit between a power source and a load, and gate terminals are connected together to a switch control contact; and the independent power source is connected between the source terminals and the switch control contact, whereby closure of the switch control contact applies a control signal to the gate terminals and closes the solid state switches.

5. A solid state testable switch module as defined in claim 4, wherein:

each current sensing circuit includes an impedance, a current detector and a blocking diode, connected in series between the independent power source and one of the solid state switches, wherein a limited test current flows through the current sensing circuit when the solid state switch to which it is connected is closed, and wherein the blocking diode blocks relatively high voltages that may be impressed on the switch from reaching the current sensing circuit.

6. A solid state testable switch module as defined in claim 1, and further comprising:

a second pair of solid state switches, a second independent power source, separate means for generating a switch test pulse, and a second pair of current sensing circuits;

wherein the second pair of solid state switches is connected in series with the first pair and is testable independently of the first pair.

7. A solid state testable switch module as defined in claim 6, and further comprising:

means for comparing test results from the two pairs of solid state switches, to eliminate any uncertainty in the test results caused by load characteristics.

8. A solid state testable switch module as defined in claim 1, wherein:

the means for generating a switch test pulse includes means for generating at least one additional test pulse spaced such that at least one of switch test pulses occurs during a non-zero portion of an alternating current waveform.

9. A solid state testable switch module as defined in claim 8, wherein:

one additional switch pulse occurs after a time corresponding to a phase angle of approximately 270° in the alternating current waveform.

10. A solid state testable switch module for connection in a load circuit between a power source and a controlled load, the switch module comprising:

a first pair of unidirectional solid state switches connected back-to-back to permit switching of current flowing in either direction, the switches each having a control terminal and two field terminals for connection to the load circuit;

a second pair of unidirectional solid state switches connected back-to-back to permit switching of current flowing in either direction, the switches each having a control terminal and two field terminals for connection to the load circuit, wherein the second pair of switches is connected in series with the first, through their field terminals;

first and second independent power sources connected to the first and second pairs of solid state switches to supply control signals to operate the switches;

first and second switch control contacts, for selectively connecting the first and second independent power sources to the control terminals of the first and second pairs of solid state switches;

means for generating switch test pulses in the first and second pairs of switches by momentarily inverting first and second switch control contracts and, therefore, the control signal operating the switches; and first and second pairs of current sensing circuits connected between the first and second independent power supplies and the respective solid state switches, for sensing a current pulses corresponding to the test pulses;

whereby the switch module is testable regardless of whether or not it is connected to a power source or a load, and regardless of whether the power source supplies alternating current or direct current.

11. A solid state testable switch module as defined in claim 10, and further comprising:

means for comparing test results from the first and second pairs of solid state switches, to eliminate any uncertainty in the test results caused by load characteristics.

12. A solid state testable switch module as defined in claim 10, wherein:

the means for generating a switch test pulse includes means for generating at least one additional switch test pulse spaced such that at least one of switch test pulses occurs during a non-zero portion of an alternating current waveform.

13. A solid state testable switch module as defined in claim 12, wherein:

one additional switch pulse occurs after a time corresponding to a phase angle of approximately 270° in the alternating current waveform.

14. A solid state testable switch module as defined in claim 10, wherein:

each current sensing circuit includes an impedance, a current detector and a blocking diode, connected in series between the independent power source and one of the solid state switches, wherein a limited test current flows through the current sensing circuit when the solid state switch to which it is connected is closed, and wherein the blocking diode blocks relatively high voltages from reaching the current sensing circuit.

15. A solid state testable switch module as defined in claim 14, wherein the current detector in each current sensing circuit includes an opto-electronic coupler, to provide an indication of current flow without a direct electrical connection.

16. A solid state testable switch module as defined in claim 10, wherein:

each of the solid state switches is a field effect transistor (FET) having source, drain and gate terminals;

the source terminals of each pair of FETs are connected together, the drain terminals are connectable to the load circuit, and the gate terminals are connected together to the switch control contact for this pair of FETs; and each of the first and second independent power sources is connected between the source terminals and the switch control contact for this pair of FETs.

17. A solid state testable switch module as defined in claim 16, wherein:

each current sensing circuit includes an impedance, a current detector and a blocking diode, connected in series between one of the independent power sources and one of the solid state switches, wherein a test current flows through the current sensing circuit when the solid state switch to which it is connected is closed, and wherein the blocking diode blocks relatively high voltages from reaching the current sensing circuit.

18. A method of testing a solid state switch module used for connection between a power source and a controlled load, the method comprising the steps of:

generating a test pulse through a first solid state switch by momentarily inverting the state of the switch;

applying a test voltage from an independent power source to the switch in addition to any load circuit voltage to which the switch may be subject; and sensing flow of test current through the switch while the test pulse is being generated, whereby a sensed current pulse is indicative of a properly operating switch;

generating a test pulse through a second solid state switch connected back-to-back with the first to permit switching of current flowing in either direction;

applying a test voltage from the same independent power source to the second switch; and sensing flow of test current through the second switch while the test pulse is begin generated, whereby a sensed current pulse is indicative of a properly operating switch.

19. A method as defined in claim 18, and further comprising:

generating at least one additional test pulse through the first and second solid state switches, wherein one additional pulse is spaced in time from the first by an amount corresponding to an alternating current phase angle selected such that at least one of the first and additional test pulses occurs at a region of the alternating current waveform in which reliable results are obtained;

sensing flow of test current through the first and second switches while the additional test pulse is being generated; and ignoring the test results obtained from one of the test pulses if the results obtained from the other test pulse indicate that the switches operate properly.

20. A method as defined in claim 18, and further comprising:

generating a test pulse to a second pair of solid state switches connected in series with and having a similar structure to the first pair;

sensing the resultant test currents in the second pair of solid state switches;

comparing the resultant test currents obtained in the first and second pairs of solid state switches; and ignoring any missing current pulse sensed in one pair of switches if a corresponding current pulse is missing from pulses sensed in the other pair of switches, since the missing pulse is probably due to load characteristics, which influence both pairs of switches equally.

21. A method as defined in claim 19, and further comprising:

generating a test pulse to a second pair of solid state switches connected in series with and having a similar structure to the first pair;

sensing the resultant test currents in the second pair of solid state switches;

comparing the resultant test currents obtained in the first and second pairs of solid state switches;

ignoring any missing current pulse sensed in one pair of switches if a corresponding current pulse is missing from pulses sensed in the other pair of switches, since the missing pulse is probably due to load characteristics, which influence both pairs of switches equally.

* * * * *